United States Patent [19]

Simon et al.

[11] Patent Number: 5,695,263

[45] Date of Patent: Dec. 9, 1997

[54] CABINET

[75] Inventors: Peter Simon, Munich; Hans Flamme, Unterhaching; Robert Streifeneder, Pilsting; Helmut Heckner, Vilshofen, all of Germany

[73] Assignee: Knurr-Mechanik für die Elektronik Aktiengesellschaft, Munich, Germany

[21] Appl. No.: 495,431

[22] PCT Filed: Feb. 21, 1994

[86] PCT No.: PCT/EP94/00496

§ 371 Date: Sep. 7, 1995

§ 102(e) Date: Sep. 7, 1995

[87] PCT Pub. No.: WO94/19850

PCT Pub. Date: Sep. 1, 1994

[30] Foreign Application Priority Data

Feb. 21, 1994 [DE] Germany ............... 9302769 U

[51] Int. Cl.[6] ........................................ A47B 47/00
[52] U.S. Cl. .............................. 312/265.4; 312/265.1; 403/13; 403/231; 403/258; 403/205
[58] Field of Search ................... 312/265.1, 265.2, 312/265.3, 265.4, 351.1; 403/13, 231, 258, 257, 260, 205, 403; 248/346.3, 346.5

[56] References Cited

U.S. PATENT DOCUMENTS

| | | | |
|---|---|---|---|
| 3,034,844 | 5/1962 | Anderson et al. | 312/265.4 |
| 4,036,149 | 7/1977 | White | 403/205 X |
| 4,726,701 | 2/1988 | Thomas | 403/205 X |
| 4,835,935 | 6/1989 | Murphy | 403/403 X |
| 4,870,711 | 10/1989 | Felix | 403/205 X |
| 5,011,323 | 4/1991 | Liuo | 403/403 X |
| 5,228,762 | 7/1993 | Mascrier | 312/265.4 |

FOREIGN PATENT DOCUMENTS 695180  4/1953  United Kingdom ............... 312/265.4

*Primary Examiner*—James R. Brittain
*Assistant Examiner*—Hanh V. Tran
*Attorney, Agent, or Firm*—Tilton, Fallon, Lungmus & Chestnut

[57] ABSTRACT

The invention relates to a cabinet for receiving electrical and electronic equipment and subassemblies with facing parts, which comprises a frame of vertical, horizontal and transverse sectional bars interconnected by means of corner connectors.

In order to obtain a particularly stable and secure cabinet, which also allows an extremely efficient manufacture and assembly, each corner connector is provided with through holes and guide elements constructed in the space coordinate direction for frontal reception and for the easy, reliable fixing of a sectional bar. In addition, each corner connector has a reception area for fixing a base. The base corner parts are preferably made from a one-piece, metallic flat material.

17 Claims, 2 Drawing Sheets

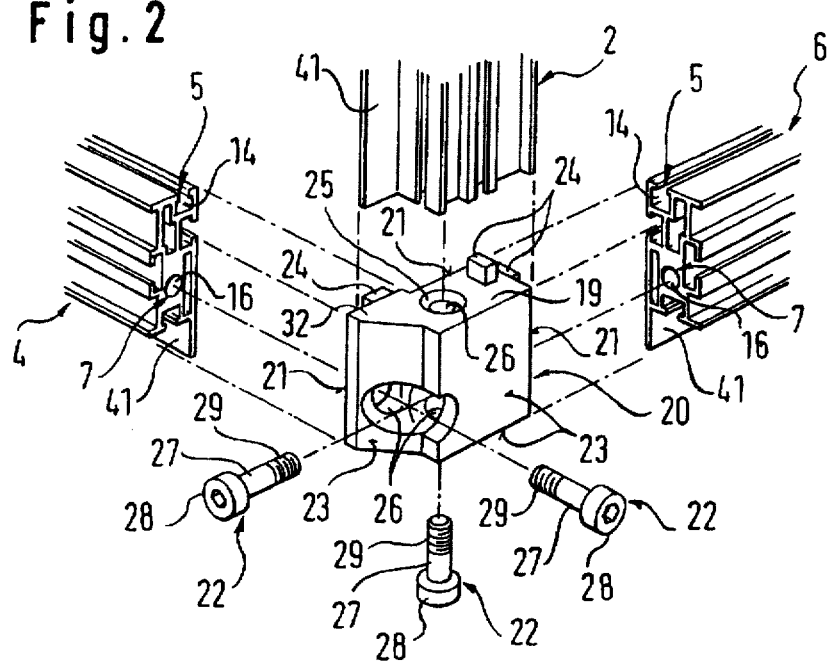
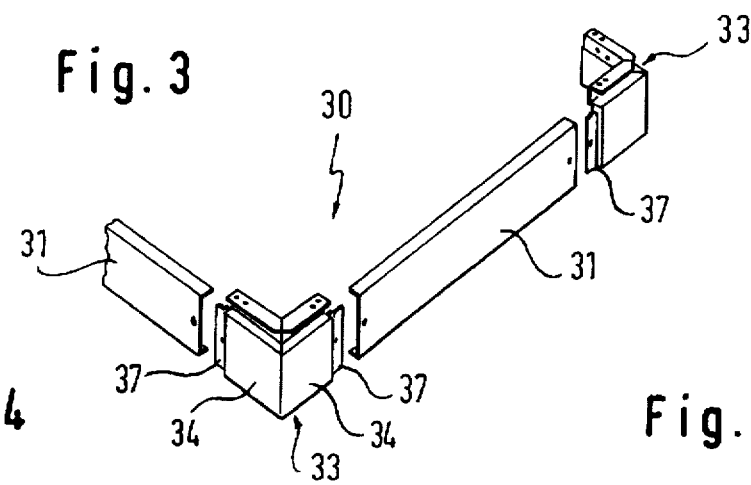
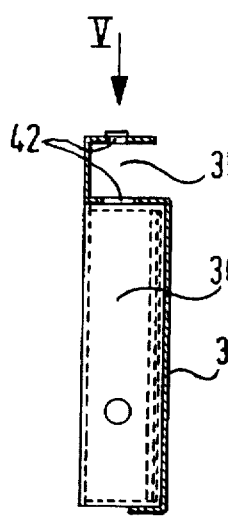
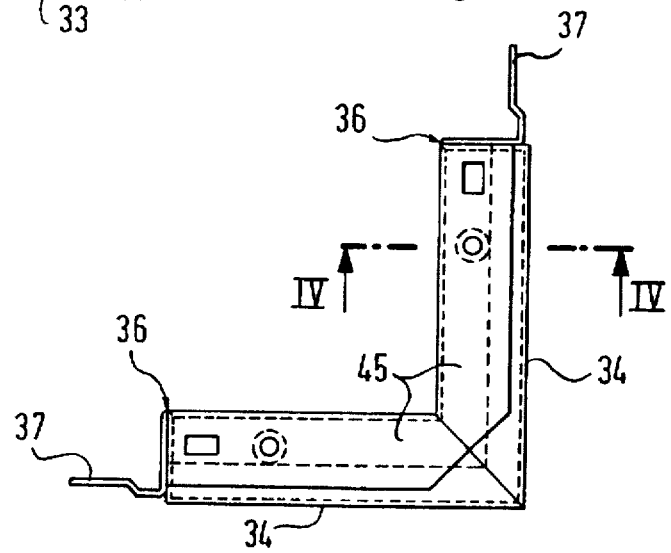

CABINET

BACKGROUND AND SUMMARY

The invention relates to a cabinet for holding electrical and electronic equipment and subassemblies.

Such cabinets, which are known as 19", control and equipment cabinets, allow numerous different fitting in and on designs and constructions and are suitable for the formation of cabinet and casing systems.

The known equipment cabinets or cabinet casings have a framework of vertical, horizontal and transverse sectional bars, whose cross-section is generally identical. The sectional bars are interconnected by means of corner connectors. As a function of the place of use and the intended use the frames are clad with an upper and lower covering and with side walls, as well as with a rear wall or door and with a front frame or door.

These known cabinets are not always able to meet the requirements with respect to a safe and stable construction. In addition, the necessary manufacturing and assembly expenditure has a disadvantageous influence on costs.

The object of the invention is to provide a stable and reliable cabinet construction, which simultaneously allows an extremely efficient manufacture and assembly.

In a construction of the sectional bars and corner connectors advantageous from the manufacturing and assembly standpoint and which are provided with guide elements for fitting on and with through holes for fixing the sectional bars with the aid of fixing elements, a positive and non-positive connection of the sectional bars is brought about on the front sides thereof.

The guide elements are in particular block-like, e.g. parallelepipedic and are constructed on connecting faces of the corner connectors, allowing in conjunction with a first, complimentary constructed cavity of the sectional bars, particularly with a front opening of a T-groove, a rapid mounting of the sectional bars with prepositioning. The fixing of the fitted sectional bars is subsequently carried out with fixing elements guided in the through holes of The corner connectors and which in each case are inserted into and secured in a second cavity of the sectional bars.

It is advantageous to use hollow corner connectors, which are inexpensively manufactured as pressure die castings. A particularly stable connection between the corner connectors and the sectional bars is obtained with the aid of assembly screws, which are guided with a smooth shank almost positively in thread-free through holes of the corner connectors and with the aid of a self-tapping thread are screwed into a more particularly centrally arranged, circular channel of the sectional bars.

Advantageously on screwing in an assembly screw into the channel provided with a smooth wall, a precise orientation of the sectional bars is obtained.

For the fitting of the cladding parts and for an unhindered opening movement of a door, it is appropriate to have a flush reception of the connecting elements. For easy handling purposes the fixing elements, e.g. countersunk head screws, are accessible from the outer faces of the corner connectors. The outer faces run in a preferred corner connector construction parallel to the connecting faces, which receive the front ends of the sectional bars.

The connecting faces on which the guide elements are in particular arranged in projecting manner, are provided in the vicinity of the exit openings of the through holes with spot facings, which can be used for receiving material thrown up occurring on screwing the assembly screws into the central channels of the sectional bars.

It is advantageous for a stable cabinet or casing construction if at least the horizontal connecting faces are constructed congruently to the adjacent, vertical sectional bars. A sealing web, which is constructed as an extension of the inside of an almost rectangular hollow section and which is in each case directed away from the cabinet interior, can e.g. rest on or be adjacent to a wedge-like constructed area of the corner connector.

For retaining bottom and top coverings, e.g. a bottom and top place or a bottom and top sheet, on the corner connectors are constructed reception areas, which in an appropriate variant project vertically outwards and horizontally inwards, relative to the cabinet or frame. The reception areas have at least one tap hole, in order to permit a screw fastening of a top plate or a bottom plate or for receiving plate-shaped feet, levelling feet or a base.

In a preferred development of the invention the cabinet is supported on a base, which in the vicinity of the corner connectors has base corner parts for absorbing forces, particularly vertical forces. In a cost-favourable manufacture the base corner parts are made from an in particular one-piece, metallic flat material, e.g. sheet steel or sheet aluminium. Through a corresponding cutting and bending two legs arranged at an angle of 90° are formed, which have an upper, e.g. welded corner receptacle for receiving the corner connectors. The corner receptacle is supported on vertical support webs constructed in double-layer form on both sides, so that an extremely high stability is obtained by means of the engaging and in particular screwed down corner connectors.

The cross-section of the base corner parts or the legs thereof is almost S-shaped and formed by an upper, outwardly open U-section part and a lower U-section part directed into the cabinet interior.

Between the base corner parts are arranged as facings base elements which can be detachably fixed by means of connecting flanges to the base corner parts. The frame sectional bars cut to length from aluminium extruded profiles have T-grooves, particularly for fixing module rails for cabinet components, equipment and subassemblies, but also for door hinges, also permit a particularly easy assembly and securing of the side walls and optionally the rear wall.

The side walls, which are appropriately provided with bent or angled marginal bars, are in each case placed on hinges in the upper sectional bars and engage round the vertical and bottom horizontal sectional bars. For safety reasons and for product liability reasons, in the marginal areas of the side walls are located snap closures and in the vicinity of the lower edge a turnbuckle, e.g. with lock cylinders, so that the side walls and/or the rear wall cannot be lifted out and unhinged by unauthorized persons.

It is advantageous to fit an additional, particularly horizontal multifunction rail between the sectional bars, particularly in the central area of the side walls. This allows new, additional installation variants. There is also an improved supporting of the components and the overall cabinet.

BRIEF DESCRIPTION OF THE DRAWINGS

The invention is described in greater detail hereinafter relative to the drawings, wherein show:

FIG. 2 In an exploded view a detail of the frame in the vicinity of a corner connector.

FIG. 3 A perspective detail view of a base.

FIG. 4 A vertical section of a base corner part along line IV—IV in FIG. 5.

FIG. 5 A plan view of a double corner part according to arrow V in FIG. 4.

DETAILED DESCRIPTION OF PREFERRED EMBODIMENTS

Figure 1:
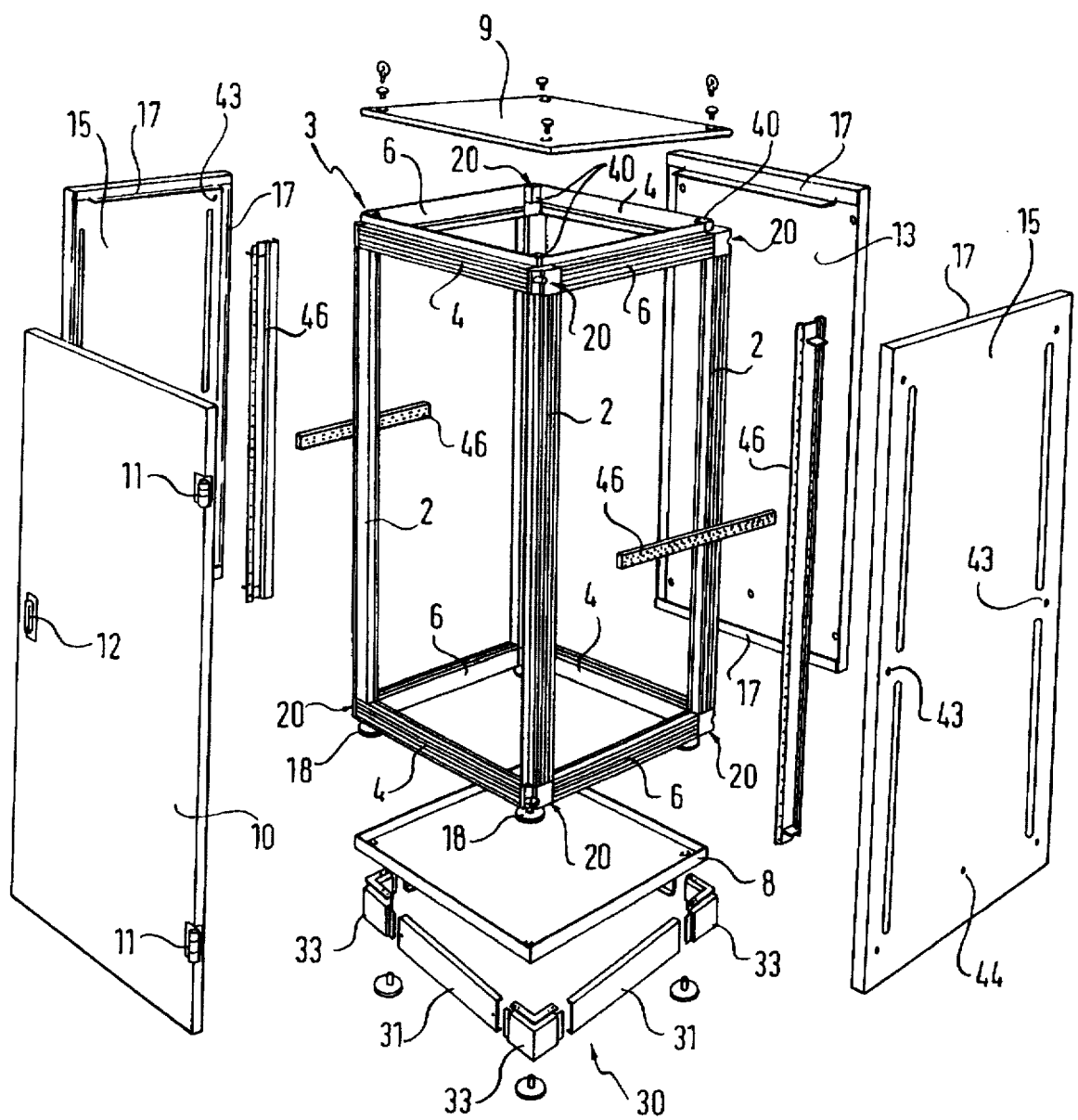
FIG. 1 An exploded view of a cabinet according to the invention.

FIG. 1 is an exploded view of a cabinet for subassemblies and equipment, which has a frame 3 with four vertical sectional bars 2, upper and lower horizontal sectional bars 4 and transverse sectional bars 6, as well as facing parts a bottom plate 8, a top plate 9, two side walls 15, a rear wall 13 and a door 10. The facing parts are e.g. constituted by painted steel sheets on which are bent all-round marginal bars or ledges 17. In conjunction with the sectional bars 2, 4 and 6 and corner connectors 20, on which the sectional bars 2, 4, 6 are fixed in the space coordinate direction, a seal can be obtained against dust, water and foreign bodies and in the case of unpainted marginal bars or ledges 17 and by means of contact strips a hf shielding of the adjacent facing parts. The side walls 15 and optionally also the rear wall 13 can be equipped with snap closures 43 and, e.g. in a bottom area, with a turnbuckle 44 having lock cylinders, in order to prevent unauthorized unhinging. The front door 10, which can be made from acrylic glass, has door hinge parts 11, which can be detachably connected with cabinet-side door hinge parts (not shown) fixed to a vertical sectional bar 2. The door is also provided with a closing device, whereof a door plate 12 with handle is shown.

In the vicinity of the side walls 15 can be installed multifunction rails 46 between horizontal sectional bars 4 and/or vertical sectional bars 2.

The sectional bars 2, 4, 6 are interconnected by means of corner connectors 20 to the frame 3. The corner connectors 20 are provided with projecting reception areas 40, to which can be fixed the top plate 9 and bottom plate 8, e.g. by means of screw connections. With the bottom plate 8 plate-shaped feet 18 or a base 30 can be fixed to the bottom-side corner connectors 20.

FIG. 2 shows on a larger scale the construction of a corner connector 20. The corner connector 20 formed from a hollow aluminium pressure die casting is provided in the space coordinate direction with three connecting faces 21 and block-like, parallelepipedic guide elements 24 and with through holes 26 for receiving fixing elements 22. In this embodiment the fixing elements 22 are constituted by assembly screws 28 with a smooth shank 27 engaging in the through holes 26 and with a self-tapping thread 29 on the front shank, which are to be screwed into a frontal, second cavity 7, particularly in a central circular channel 16 of the sectional bars 2, 4, 6, accompanied by the alignment of the latter. The through holes 26 are provided at their exit openings with spot facings 25, which can be used for collecting the turnings or material thrown up during screwing in.

During the frontal fitting of the aluminium pressure die casting bars 2, 4, 6 the projecting guide elements 24 engage with frontal openings of T-grooves 14, which in complimentary manner to the guide elements 24 have a rectangular cross-section. FIG. 2 makes it clear that the horizontal reception faces 19 of the corner connector 20 are constructed congruently to the cross-section of the sectional bars, 2, 4, 6 and that wedge-shaped areas 32 receive the sealing webs 41 of the vertical sectional bars 2.

The fixing elements 22 are introduced from the outer faces 23 into the through holes 26. The reception areas 40, which are in each case formed on reception faces 21 directed towards the horizontal sectional bars 4, are not shown in this drawing (cf. FIG. 1).

FIGS. 3, 4 and 5 show the construction of a base 30. In FIG. 3 the base 30 with the base corner parts 33 and the base elements 31 to be fixed between the latter are shown. The base elements 31 are U-sections, which can be engaged with their frontal recesses on connecting flanges 37 of the base corner parts 33 and fixed.

The base corner parts 33 are constructed as stable supporting elements and in an advantageous manner from the manufacturing standpoint are folded from a sheet steel blank. The base corner parts 33, as can be gathered from FIG. 1, placed below the corner connectors 20, in particular for absorbing the vertical forces. For load absorbing purposes the base corner parts 33 comprising two legs 34 bent at right angles to one another have a cross-sectionally S-shaped construction (FIG. 4). On an upper, outwardly open U-sectional part 35 with a passage opening 42 for connecting the base corner parts 33 and corner connectors 20 is connected a lower U-sectional part 39. On the upper sectional part 35 is formed a corner receptacle 45 e.g. by welding the edges of a recess, which rest on one another after the bending down of the one-piece flat material. On the corner receptacle 45 are supported the corner connectors 20 with the engaging vertical sectional bars 2. A particularly high stability is achieved through double-layer, vertical support webs 36, which are formed on the leg ends and over the entire depth of the upper sectional part 35 by a double fold.

We claim:

1. Cabinet for receiving electrical and electronic equipment and subassemblies, with vertical (2), horizontal (4) and transverse sectional bars (6), which are constructed as hollow sections with an almost rectangular cross-section and with a sealing web (41) and are connected by means of corner connectors (20), which have at least on horizontal reception surface (19), to a framework (3), which can be equipped with cladding parts, particularly a bottom plate (8), top plate (9), door (10), rear wall (13) and side walls (15), each corner connector (20) having in the space coordinate direction guide elements (24) and through bores (26) and each guide element (24) for the frontal mounting of one of the sectional bars (2, 4, 6) is constructed in complimentary manner to a first cavity (5) of the sectional bar (2, 4, 6) and in the through bores (26) are guided fixing elements (22), which can be fixed in a second cavity (7) of the sectional bars (2, 4, 6), wherein the sectional bars (2, 4, 6) have a same cross-section, that the sealing web (41) of the sectional bars (2, 4, 6) is constructed as an extension of an inner wall of the hollow section adjacent to the cabinet interior, that the horizontal reception surfaces (19) of the corner connectors are constructed congruently to the cross-section of the sectional bars (2, 4, 6) and are provided with a wedge-shaped area (32) for supporting the sealing web (41) of the vertical sectional bars (2) and that each corner connector (20) has a reception area (40) for retaining the bottom plate (8) or the top plate (9) and for fixing a base (30), the reception area (40) projecting vertically outwards and horizontally inwards with respect to the cabinet interior.

2. Cabinet according to claim 1, wherein each corner connector (20) is constructed as a hollow pressure die casting having connecting faces (21) for the sectional bars (2, 4, 6) and wherein the connecting faces (21) are provided with the guide elements (24), which are block-like formed and on which can be engaged the sectional bars (2, 4, 6) with a frontal opening of a T-groove (14).

3. Cabinet according to claim 2, wherein the exit openings of the through bores (26) are constructed on the connecting faces (21) of the corner connectors (20) and are provided with spot facings (25).

4. Cabinet according to claim 1, wherein the through bores (26) are accessible from outer faces (23), particularly of the wedge-shaped area (32) of the corner connector (20) and are constructed for a flush reception of assembly screws (28) as fixing elements (22).

5. Cabinet according to claim 4, wherein the assembly screws (28) having a smooth shank (27) and a self-tapping thread (29) are guided in the through bores (26) and can be screwed with the self-tapping thread (29) into a central, circular channel (16) as a second cavity (7) of the sectional bars (2, 4, 6).

6. Cabinet according to claim 1, wherein each reception area (40) of the corner connector (20) is constructed for the fixing of the base (30).

7. Cabinet according to claim 1, wherein in the vicinity of the corner connectors (20), the base (30) has base corner parts (33), particularly for absorbing vertical forces.

8. Cabinet according to claim 7, wherein the base corner parts (33) are made from a flat material.

9. Cabinet according to claim 7, wherein the base corner parts (33) are made from a one-piece metallic flat material.

10. Cabinet according to the claim 7, wherein the base corner parts (33) have two legs (34) bent at right angles with double-layer, vertical support webs (36), on which is supported an upper sectional part (35) of the base corner part (33).

11. Cabinet according to claim 10, wherein the upper sectional part (35) is an outwardly open U-section with a corner receptacle (45) formed by a recess in the flat material and which with a lower U-sectional part (39) forms an almost S-shaped cross-section of the base corner part (33).

12. Cabinet according to claim 10, wherein on the legs (34) of the base corner parts (33) are formed connecting flanges (37) for insertion in the base elements (31) connecting the base corner parts (33).

13. Cabinet according to claim 1, wherein the side walls (15) and the rear wall (13) have bent marginal ledges (17), which engage behind a recess, particularly a T-groove, of the upper and lower horizontal sectional bars (4) or the transverse sectional bars (6) and a sealing is obtained by means of the sealing web (41) on the inside of the sectional bars (2, 4, 6).

14. Cabinet according to claim 1, wherein at least the side walls (15) are provided with lateral snap closures (45) and bottom turnbuckles, which in particular have lock cylinders (44).

15. Cabinet according to claim 1, wherein the sectional bars (2, 4, 6) are made from extruded sections which have been cut to length and on the vertical sectional bars (2) and on the horizontal sectional bars (6) can be fixed multifunction rails (46), particularly in the central area of the side walls (15).

16. Cabinet for receiving electrical and electronic equipment and subassemblies, with vertical (2), horizontal (4) and transverse sectional bars (6), which are constructed as hollow sections with an almost rectangular cross-section and with a sealing web (41) and are connected by means of corner connectors (20), which have at least one horizontal reception surface (19), to a framework (3), which can be equipped with cladding parts, particularly a bottom plate (8), top plate (9), door (10), rear wall (13) and side walls (15), each corner connector (20) having in the space coordinate direction guide elements (24) and through bores (26) and each guide element (24) for the frontal mounting of one of the sectional bars (2, 4, 6) is constructed in complimentary manner to a first cavity (5) of the sectional bar (2, 4, 6) and in the through bores (26) are guided fixing elements (22), which cab be fixed in a second cavity (7) of the sectional bars (2, 4, 6), wherein the sectional bars (2, 4, 6) have a same cross-section, that the sealing web (41) of the sectional bars (2, 4, 6) is constructed as an extension of an inner wall of the hollow section adjacent to the cabinet interior, that the horizontal reception surfaces (19) of the corner connectors are constructed congruently to the cross-section of the sectional bars (2, 4, 6) and are provided with a wedge-shaped area (32) for supporting the sealing web (41) of the vertical sectional bars (2) and that each corner connector (20) has a reception area (40) for retaining the bottom plate (8) or the top plate (9) and for fixing a base (30), the reception area (40) projecting vertically outwards and horizontally inwards with respect to the cabinet interior, said exit openings of the through bores (26) are constructed on the connecting faces (21) of the corner connectors (20) and are provided with spot facings (25).

17. Cabinet for receiving electrical and electronic equipment and subassemblies, with vertical (2), horizontal (4) and transverse sectional bars (6), which are constructed as hollow sections with an almost rectangular cross-section and with a sealing web (41) and are connected by means of corner connectors (20), which have at least one horizontal reception surface (19), to a framework (3), which can be equipped with cladding parts, particularly a bottom plate (8), top plate (9), door (10), rear wall (13) and side walls (15), each corner connector (20) having in the space coordinate direction guide elements (24) and through bores (26) and each guide element (24) for the frontal mounting of one of the sectional bars (2, 4, 6) is constructed in complimentary manner to a first cavity (5) of the sectional bar (2, 4, 6) and in the through bores (26) are guided fixing elements (22), which can be fixed in a second cavity (7) of the sectional bars (2, 4, 6), wherein the sectional bars (2, 4, 6) have a same cross-section, that the sealing web (41) of the sectional bars (2, 4, 6) is constructed as an extension of an inner wall of the hollow section adjacent to the cabinet interior, that the horizontal reception surfaces (19) of the corner connectors are constructed congruently to the cross-section of the sectional bars (2, 4, 6) and are provided with a wedge-shaped area (32) for supporting the sealing web (41) of the vertical sectional bars (2) and that each corner connector (20) has a reception area (40) for retaining the bottom plate (8) or the top plate (9) and for fixing a base (30), the reception area (40) projecting vertically outwards and horizontally inwards with respect to the cabinet interior, said side walls (15) and the rear wall (13) having bent marginal ledges (17), which engage behind a recess, particularly a T-groove, of the upper and lower horizontal sectional bars (4) or the transverse sectional bars (6) and a sealing is obtained by means of the sealing web (41) on the inside of the sectional bars (2, 4, 6).

* * * * *